United States Patent [19]

Reddy et al.

[11] Patent Number: 5,465,367
[45] Date of Patent: Nov. 7, 1995

[54] SLOW MEMORY REFRESH IN A COMPUTER WITH A LIMITED SUPPLY OF POWER

[75] Inventors: Chandrashekar M. Reddy, Santa Clara; Scott D. Hirose, San Jose; Sung-Soo Cho, Sunnyvale; James P. Kardach, San Jose; Steven M. Farrer, Santa Clara; Meeling Roberts, Fremont, all of Calif.

[73] Assignee: Intel Corporation, Santa Clara, Calif.

[21] Appl. No.: 277,771

[22] Filed: Jul. 19, 1994

Related U.S. Application Data

[63] Continuation of Ser. No. 963,282, Oct. 19, 1992, abandoned, which is a continuation of Ser. No. 597,363, Oct. 12, 1990, abandoned.

[51] Int. Cl.⁶ .................................................. G06F 1/32
[52] U.S. Cl. ............................ 395/750; 364/DIG. 1; 364/246.6; 364/246.91; 364/273.1
[58] Field of Search ........................... 395/750; 365/222, 365/227, 228, 223

[56] References Cited

U.S. PATENT DOCUMENTS

| | | | |
|---|---|---|---|
| 4,137,563 | 6/1979 | Tsunoda | 395/750 |
| 4,317,180 | 2/1982 | Lies | 364/707 |
| 4,317,181 | 2/1982 | Teza et al. | 364/707 |
| 4,570,219 | 2/1986 | Shibukawa et al. | 395/775 |
| 4,615,005 | 9/1986 | Maejima et al. | 395/550 |
| 4,686,386 | 8/1987 | Tadao | 365/228 |
| 4,698,748 | 10/1987 | Juzswik et al. | 395/750 |
| 4,707,142 | 11/1987 | Baker et al. | 364/46 |
| 4,825,407 | 4/1989 | Loessel et al. | 395/750 |
| 4,841,440 | 6/1989 | Yonezu et al. | 395/750 |
| 4,851,987 | 7/1989 | Day | 395/550 |
| 4,881,205 | 11/1989 | Aihara | 365/233 |
| 4,893,271 | 1/1990 | Davis et al. | 395/750 |
| 4,901,283 | 2/1990 | Hanbury et al. | 365/222 |
| 4,907,150 | 3/1990 | Arroyo et al. | 395/575 |
| 4,918,650 | 4/1990 | De Wolf | 395/425 |
| 4,953,131 | 8/1990 | Purdham et al. | 365/222 |
| 5,025,387 | 6/1991 | Frane | 395/750 |
| 5,041,964 | 8/1991 | Cole et al. | 395/425 |
| 5,083,266 | 1/1992 | Watanabe | 395/750 |
| 5,167,024 | 11/1992 | Smith et al. | 395/375 |
| 5,218,607 | 6/1993 | Saito et al. | 371/66 |
| 5,247,655 | 9/1993 | Khan et al. | 395/550 |
| 5,276,890 | 1/1994 | Arai | 395/750 |
| 5,392,438 | 2/1995 | Gunji | 395/750 |
| 5,410,714 | 4/1995 | Yorimoto et al. | 395/750 |

*Primary Examiner*—Jack B. Harvey
*Assistant Examiner*—Ayaz R. Sheikh
*Attorney, Agent, or Firm*—Blakely, Sokoloff, Taylor & Zafman

[57] ABSTRACT

A power suspend mode activates a slow DRAM refresh in a computer system with a limited source of power. The power suspend mode reduces the power consumed by the computer system while preserving the contents of memory. The cyclic refresh of DRAM using a slow refresh clock substantially reduces the power consumed while the computer is suspended. This technique is particularly useful for battery powered portable computer systems. When an external or internal condition causes the computer system to transition to a power down mode, an IO subsystem notifies the CPU which sets control bits in the IO subsystem and a video subsystem. The IO subsystem then begins to generate a slow DRAM refresh pulse. Once the CPU and video subsystem sense the power suspend mode activation, the system memory and video memory are refreshed using the slow refresh clock. The power consumed during the refresh process is thereby greatly reduced. When a resume signal is received by the IO subsystem, the slow refresh clock is terminated and the system memory and video memory are again refreshed using a normal faster clock.

30 Claims, 2 Drawing Sheets

SLOW MEMORY REFRESH IN A COMPUTER WITH A LIMITED SUPPLY OF POWER

This is a continuation of application Ser. No. 07/963,282, filed Oct. 19, 1992, now abandoned.

FIELD OF THE INVENTION

This invention relates to the field of computer architecture, and particularly to a method and apparatus for providing a slow memory refresh in a computer with a limited supply of power.

BACKGROUND OF THE INVENTION

Reducing power consumption is an important issue in many modern personal computers. This issue is particularly important for battery-powered lap-top or notebook style portable computers. Other computers with a limited supply of power also need to be designed with a concern for power conservation. Computers with a limited supply of power are often those designed to be portable. In order to achieve the portability of these computer systems, the power consumed by the system components must be minimized. Reduced power consumption prolongs the battery life and thus increases the feasibility of the computer as a portable system. Clearly, the simplest way to conserve power is to shut the system down entirely; however, shutdown destroys the contents of memory and forces the user to restart and re-boot the computer from scratch. A better method is to provide a reduced power mode which supplies a minimal level of power to vital subsystems thereby saving the processing state of the computer.

Many of these portable computers include a memory subsystem for storing data and instructions for the processor and a video subsystem for storing and displaying a video image on a display screen. The memory subsystem and a video memory in the video subsystem may be configured using dynamic random access memory (DRAM) devices for storing information. DRAMs require a cyclic refresh signal supplied by the computer system in order to prevent the information stored in DRAM from being destroyed. It is advantageous to implement a reduced power mode wherein the operation of the computer is suspended, but the memory subsystem and video memory is saved. In this way, the computer user may reactivate the system after a suspended period and obtain the same system state and display as present prior to the suspension.

Several systems and methods exist in the prior art for providing a reduced power mode in a computer with a limited source of power. One such system saves the contents of system memory and video memory on a hard disk or a non-volatile memory prior to removing power from the system. This method has several disadvantages. First, the computer system must be configured with a hard disk or non-volatile memory resource. A particular computer may not be so configured. Also, a hard disk or non-volatile memory is an expensive component which raises the overall cost of the system. Secondly, the disk access necessary for saving and restoring memory is a relatively slow operation. There may be a delay in response to the entry and return from the suspend mode. Thirdly, if the suspend mode is entered as a result of a low battery condition, there may not be enough power to access the disk. Disk access is a relatively power intensive operation.

Other systems providing a reduced power mode in a computer with a limited source of power implement such a mode by using static RAM (SRAM) or pseudo static RAM (PSRAM) for system and video memory. SRAM does not require a cyclic refresh signal as required by DRAM. SRAM can therefore operate at a low power consumption rate during a suspend mode without losing data. PSRAM must be put into a standby mode in order to operate the device without refresh. Unfortunately, SRAMs are substantially more expensive than DRAMs. Thus, the overall system cost increases and the competitiveness of the computer system in the marketplace decreases.

Still other systems implement a video memory save operation where the video memory contents are saved in a system memory area. This technique, however, does not reduce the power consumption in the computer system. If system memory is DRAM, the system memory must still be refreshed during a suspend mode. If system memory is SRAM or some form of non-volatile memory, the system cost increases as mentioned above. In addition, such systems may require additional system memory in order to have enough space to hold the contents of video memory during a power suspend mode. Additional software may also be required to control the allocation and maintenance of system memory used to hold video memory during suspend mode. This additional software may lead to a specially configured BIOS thereby reducing the general applicability of the BIOS supplied with a basic system.

A better computer system design is needed for implementing a more efficient and less expensive power suspend mode.

SUMMARY OF THE INVENTION

The present invention provides a power suspend mode with a slow DRAM refresh in a computer system with a limited source of power. The power suspend mode reduces the power consumed by the computer system while preserving the contents of memory. The cyclic refresh of DRAM using a slow refresh clock substantially reduces the power consumed while the computer is suspended.

The present invention is particularly adapted for use in connection with a microprocessor-based chip set for use in battery-powered personal computers, especially computers of the "notebook" or "laptop" variety. Such a chip set includes a CPU chip, an IO chip, and typically, a graphics chip.

During a power suspended state, tile processor and/or other system devices may be effectively shut down during periods of non-use and then re-started without the need to go through a power up routine. This function is particularly useful in connection with battery-powered computers where power conservation is a primary concern. A key feature of the present invention is that the system may be powered down and later brought back to the same point in an application program at which it was left. Thus, for example, if a computer operator is interrupted while working with an application program, the system can suspend power to conserve battery life. When the operator returns to use the system, it is restored to the same point in the application program as if the system had been running throughout the intervening period of time. The operator need not take any action to save application program results prior to the interruption, nor need the operator take any action to reload the application program when returning to use the computer.

In order to resume the operation of the computer after suspension without the need for re-booting or executing a power up routine, the contents of memory is preserved throughout tile power suspension period. Since DRAM is used in the computer system of the present invention, a significant level of power is required to periodically refresh the contents of DRAM even while suspended. In order to minimize the consumption of power during the DRAM refresh operation, the cyclic refresh of DRAM is slowed to a minimal rate while the computer is suspended thereby substantially reducing the power necessary for preserving the contents of memory.

The computer system of the preferred embodiment comprises a GENCPU (central processing unit) subsystem, an GENIO (input/output) subsystem, and a GENVGA video subsystem. These subsystems are coupled by a data bus. A system memory is coupled to the CPU and a video memory is coupled to the video subsystem. Both the system memory and the video memory comprise low cost DRAM devices requiring a periodic refresh. During normal operations in the preferred embodiment, the video DRAM is refreshed using a 48 MHz clock. System DRAM is refreshed during normal operations using a 16 MHz clock.

The power suspend mode is initiated by the occurrence of an external or internal event and the execution of a suspend instruction by the CPU. Once the suspend instruction is executed, the CPU signals the IO subsystem and the video subsystem of the pending request for suspension by asserting two control bits. One control bit is associated with the video subsystem; the other control bit is associated with the IO subsystem. When the IO subsystem senses the assertion of its associated control bit, GENIO asserts a system power off signal which is received by the video subsystem. GENCPU and other components of the computer system. The pins connecting the CPU, the IO subsystem and the video subsystem to the bus are set to a tri-state (i.e. high impedance) condition which effectively disables communication over the bus. At nearly the same time, the IO subsystem begins sending a slow (32 KHz) clock signal to the CPU and the video subsystem. After the CPU sets the two control bits, the CPU begins to use the slow clock for refreshing the system DRAM. As a result of the assertion of the video subsystem suspend control bit and the system power off signal, the video subsystem begins using the slow clock for refreshing the video DRAM. Other non-essential components are shut down following the activation of the system power off signal.

When the IO subsystem receives a resume signal as a result of some user or system action. GENIO disables the system power off signal and enables its communication with the bus by removing the tri-state condition. Similarly, GENVGA and GENCPU enable bus communication by removing the tri-state condition on the bus interface. When the CPU senses the deactivation of the system power off signal, a CPU reset is generated, a resume instruction is executed, the system state is restored. The CPU then deactivates the suspend control bits associated with the IO subsystem and the video subsystem. As a result of the deactivation of the system power off signal and the suspend control bits, the video subsystem enables normal refresh clock signals. The video memory and system memory are then switched to the normal fast refresh clock cycle.

DETAILED DESCRIPTION OF THE PREFERRED EMBODIMENT

In the following description, for purposes of explanation and not limitation, specific register structures, mappings, bit assignments, etc. are set forth in order to provide a thorough understanding of the present invention. However, it will be apparent to one skilled in the art that the present invention may be practiced in other embodiments that depart from these specific details. In other instances, detailed descriptions of well known aspects of microprocessor systems are omitted so as to not obscure the description of the present invention with unnecessary detail.

System Overview

The present invention is advantageously employed in a microprocessor design optimized for applications requiring low power consumption and compact size. Such applications particularly include small battery-powered personal computers of the types commonly referred to as laptops and notebooks. One preferred embodiment of such a microprocessor is brief described below; however, it is to be understood that the present invention is not limited to this particular microprocessor design, and may be incorporated in virtually any processor design.

Figure 1:
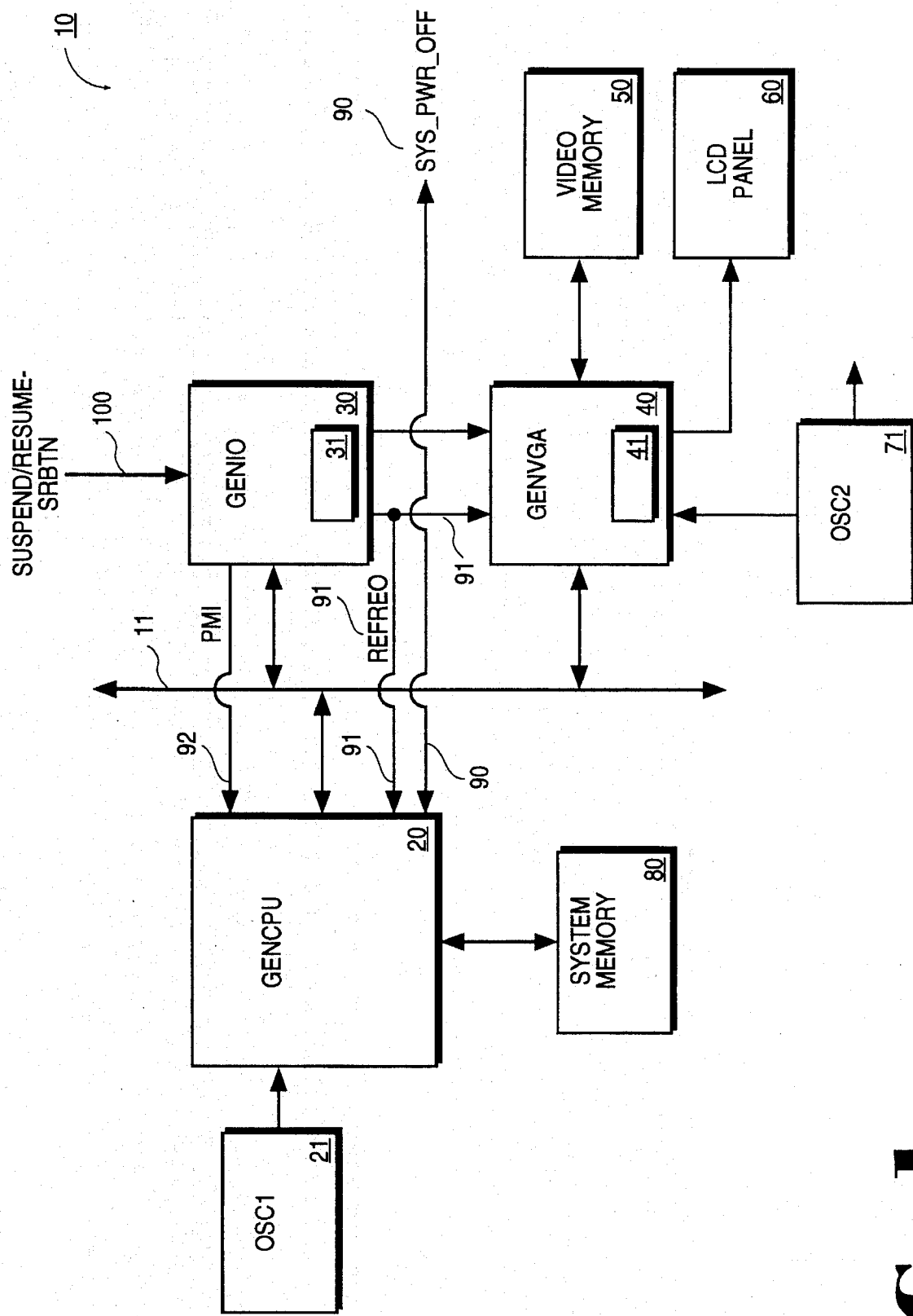
FIG. 1 is a functional block diagram of a microprocessor system embodying the preferred embodiment of the present invention.

Referring to FIG. 1, a preferred embodiment of the computer system 10 of the present invention is shown. In the preferred embodiment, computer system 10 includes a 386™SL Microprocessor manufactured by Intel Corporation, the corporate assignee of this invention. Such a computer system is compatible with the IBM™ PC AT Personal Computer. System 10 comprises three main processor components, designated as GENCPU 20, GENIO 30 and GENVGA 40. The combination of GENCPU 20 and GENIO 30 without the improvement disclosed herein are available from Intel Corporation under a product designation of 386™SL Microprocessor SuperSet. GENCPU is an expanded central processing unit including a CPU, a memory controller, a cache controller, bus control logic and line buffers. A system memory 80 is coupled to GENCPU. System memory 80 substantially comprises dynamic random access memory (DRAM) devices. System DRAM requires a periodic refresh pulse in order to retain data. In normal operations of tile computer system, this normal clock refresh pulse (i.e. first clock) is supplied to tile system DRAM using a 16 MHz clock. System clock oscillator 21 for refreshing system DRAM 80 at a normal clock is also coupled to the GENCPU.

GENIO is a single chip input/output unit comprising parallel ports, dual serial ports, a real time clock unit, dual programmable interrupt controllers, dual programmable timers, dual DMA controllers and a memory mapper. GENIO also contains a register 31 denoted the PM_SUS_REF register. This register is used to command the GENIO to transition to the suspend mode. A bit in this register IO_SUS_REF is asserted by GENCPU 20 when suspend mode is requested. In addition, a suspend/resume signal 100 is received by GENIO. The suspend/resume signal 100 is used to request the power suspend mode on the occurrence of a hardware event. Such a hardware event may be a battery low condition, tile expiration of a time-out timer, or the activation of a suspend/resume button on the computer case. For example, the action of opening or closing a lid on the computer case may activate the suspend/resume button.

In a suspend mode, GENIO provides two signals to system 10. The first signal 90 is a SYS_PWR_OFF signal.

This signal indicates that the system 10 has transitioned to a power suspend mode. In response to this signal, other subsystems shut down non-vital components in order to conserve power. The second signal provided by GENIO is the REFREQ signal 91. This signal is the slow (32 KHz) clock (i.e. second clock) used to refresh system DRAM 80 and video DRAM 50 during power suspend mode. REFREQ 91 is therefore connected to GENCPU 20 and GENVGA 40 as shown if FIG. 1. The details of the operation of these and other signals during suspend mode is described below.

GENVGA is a single chip graphics interface comprising a VGA graphics controller, video memory controller and flat panel display unit 60. Oscillator 71 for refreshing video DRAM 50 using a normal (48 MHz) clock is also coupled to the GENVGA. A video memory 50 is coupled to GEN-VGA. Video memory 50 substantially comprises DRAM devices. GENVGA also contains a register 41 denoted the PM_SUS_REF register. This register is used to command the GENVGA to transition to the suspend or resume mode. A bit in this register VGA_SUS_REF is asserted by GENCPU 20 when suspend mode is requested. In the preferred embodiment, the PM_SUS_REF register 31 in GENIO and the PM_SUS_REF register 41 in GENVGA are actually the same register. One register is a shadow of the other. In an alternative embodiment, there may be two separate registers, one in GENIO and the other in GEN-VGA. In either case, however, the two control bits in the PM_SUS_REF register, IO_SUS_REF and VGA_SUS_REF, are distinct and separate control bits. IO_SUS_REF is associated only with GENIO; VGA_SUS_REF is associated only with GENVGA. GENIO is able to sense when IO_SUS_REF transitions to an active or inactive state. GENVGA is able to sense when VGA SUS REF transitions to an active or inactive state.

All of the subsystems communicate with one another and with other system components (such as expansion slots, keyboard controller, disk controllers, etc.) via bus 11. In the preferred embodiment, bus 11 is an AT compatible bus. This type of bus is well known in the art.

Power Management

In the preferred embodiment, one function implemented by the present invention is a suspend/resume function. Suspend/resume comprises a process wherein an internal or external event indicates to the computer system that it will be inactive for some extended period of time. For example, such an event may comprise an operator's action of closing the computer case or lid or it may comprise the expiration of an event timer. In response to the detected event, the computer selectively powers down to a low power consumption mode (i.e. power suspend mode). In response to a second event, such as the operator's opening of the computer case or lid, the computer system is automatically restored to the application program running at the time that the first event was detected.

Although the power management function is particularly useful for conserving power in a battery-powered computer system, it also has applications in desktop systems where power conservation is not a primary concern. In this regard, the process of bringing up and shutting down an operating system is often lengthy. The present invention allows an operator to turn "off" a computer system without shutting down the operating system. Likewise, the operator can turn the computer system "on" without having to go through the initialization process of the operating system.

In a variation of tile suspend/resume function, a standby mode may be entered when the con, purer system is on but has remained idle for some predetermined period of time. When time-out occurs, an instruction or interrupt is invoked placing the system in a minimum power consumption mode. In response to an event, such as an operator action, the system is restored to the operating mode by the resume procedure.

Operation During Suspend Mode

Figure 2:
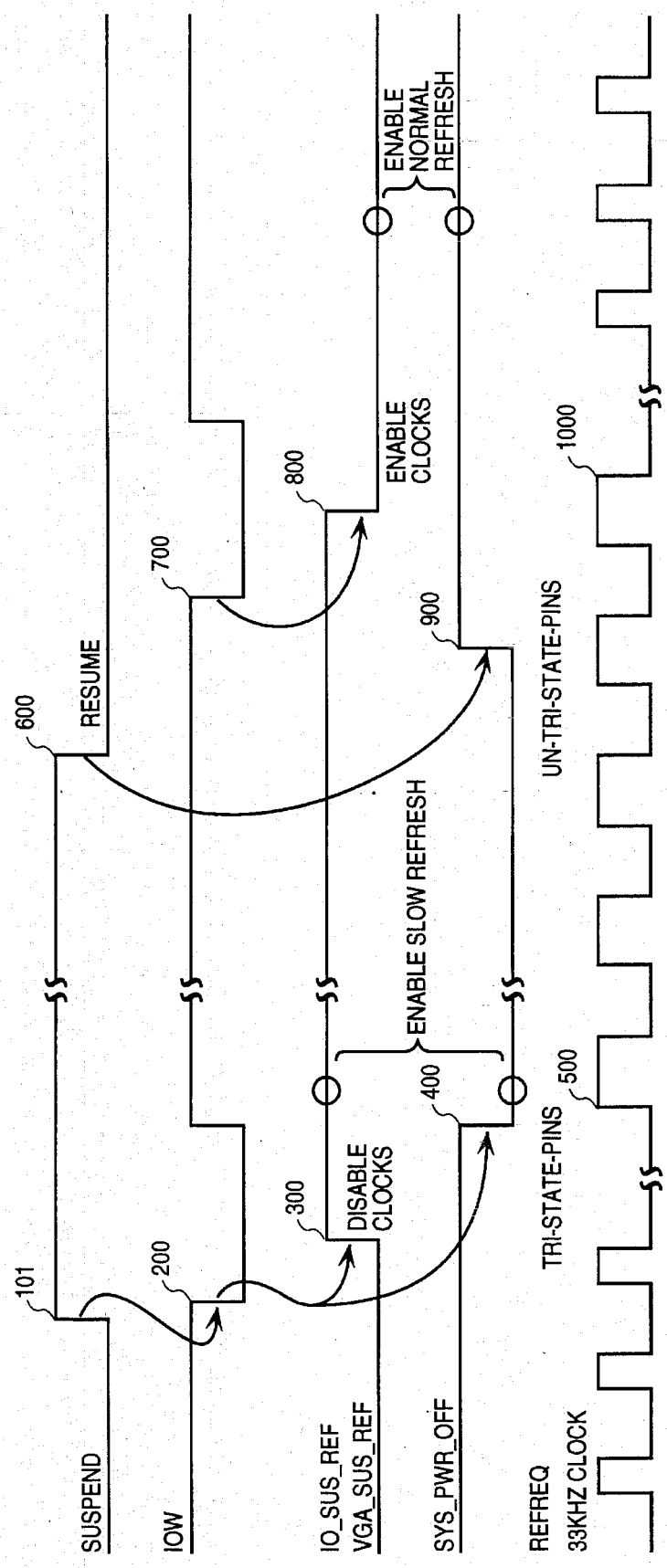
FIG. 2 is a liming diagram of signals associated with the present invention.

In the preferred embodiment, the operation of the computer system is suspended on tile occurrence of a hardware event, such as a battery low condition, the expiration of a time-out clock, or the activation of a suspend/resume button on the computer case. When a suspend event occurs, tile GENIO subsystem 30 is the first subsystem to be notified of the suspend request. This notification may occur as a result of an active SRBTN signal 100 as a result of the closure of the computer lid. The suspend notification may also occur internally to the GENIO as a result of the expiration of a time-out clock or a battery-low condition. In either case, a suspend request is activated in the GENIO subsystem 30. This suspend request is indicated by the rising edge 101 as shown in FIG. 2.

As a result of the active suspend request, GENIO generates a power management interrupt (PMI) 92 to the GENCPU 20. The PMI 92 is transmitted to GENCPU 20 as shown in FIG. 1. On receipt of the PMI, GENCPU saves the processing state of the system. This save operation includes saving the contents of system registers and stack pointers in a power management memory area. Saving the state of the system allows processing to resume normally after the power suspension period has been terminated and normal power has been restored. GENCPU 20 is then vectored to an interrupt processing routine containing program logic for handling the suspend request. One instruction in this programming logic is a suspend IO command.

After GENCPU 20 has saved the state of the system, GENCPU 20 begins to execute the program logic for handling the suspend request. As part of this sequence, GENCPU issues a write cycle (IOW) on bus 11 in order to set the suspend control bits IO_SUS_REF and VGA_SUS_REF to an active level. This IOW cycle is indicated by the falling edge 200 illustrated in FIG. 2. In an alternative embodiment, two IOW cycles may be required if the PM_SUS_REF register 31 in the GENIO is a separate register from the PM_SUS_REF register 41 in the GENVGA. In the preferred embodiment, only one IOW cycle is required to activate both suspend control bits IO_SUS_REF and VGA_SUS_REF. The activation of these control bits is depicted by the rising edge 300 depicted in FIG. 2.

Once the IO_SUS_REF and VGA_SUS_REF control bits are set by GENCPU 20, GENIO responds by asserting the SYS_PWR_OFF signal line 90 shown in FIG. 1. The activation of SYS_PWR_OFF is shown by the falling edge 400 shown in FIG. 2. As a result of the active SYS_PWR_OFF signal, power to all peripheral devices and controllers is shut down with the exception of GENCPU, GENIO, GENVGA, system memory 80 and video memory 50. The pins connecting the GENIO, GENCPU, and GENVGA to the bus 11 are set to a tri-state condition which effectively disables communication over the bus 11. In addition, GENIO begins generating a slow (32 KHz) clock signal REFREQ 91 shown in FIG. 1. A timing diagram 500 of the slow clock signal REFREQ is shown in FIG. 2. REFREQ is received by both GENCPU and GENVGA.

As a result of the activation of suspend control bit VGA_SUS_REF, GENVGA interrupts the normal refresh video DRAM 50 by disabling the clock signals provided by oscillator 71. This action occurs at the rising edge 300 depicted in FIG. 2. When GENVGA receives the active SYS_PWR_OFF signal 90 generated by GENIO while the VGA_SUS_REF bit is active, GENVGA begins to use the slow clock REFREQ to refresh video DRAM 50. The time between disabling normal refresh and enabling slow refresh is fast enough to not miss a refresh cycle. This slow refresh of video DRAM serves to substantially reduce the power consumption of the system while still preserving the contents of video DRAM. In an alternative embodiment, GENVGA does not use the VGA_SUS_REF bit to signal the switch to slow refresh. Instead, GENVGA delays for a time period after receiving the activated SYS_PWR_OFF signal. The delay required may be as much as 30 to 50 milliseconds. In the preferred embodiment, however, the combination of VGA_SUS_REF bit and the SYS_PWR_OFF signal provides a better implementation. After receiving the active SYS_PWR_OFF signal 90, GENVGA also disables its communication on bus 11 by setting its bus interface pins to a tri-state condition.

When GENCPU receives the active SYS_PWR_OFF signal 90 generated by GENIO, GENCPU begins to use the slow clock REFREQ to refresh system DRAM 50. During the suspend mode, all logic other than the slow refresh of system DRAM and video DRAM and a suspend/resume state machine in GENIO is idle.

Operation During Resume Mode

The system 10 is in a power suspend state as long as the SYS_PWR_OFF signal is asserted. A hardware indication may be used to signal the termination of suspend mode and the resumption of normal operations. Such a signal may be denoted as a resume signal. A resume signal may be provided for a variety of reasons. In the preferred embodiment, a resume signal is generated mainly as a result of the opening of a cover on the computer. The opening of the computer cover causes a transition to occur on a switch operably coupled to the computer casing or the computer cover itself. In an alternative embodiment, a resume signal can be generated as a result of the computer user simply touching the keyboard or mouse device connected to the computer. In still another embodiment, a resume signal can be generated as a result of a ring detect signal received by a modem connected to the computer system 10. For any of these or other conceivable reasons, the user or system event signals the computer system that resumption of normal operations is desired.

A resume signal may be provided to the GENIO subsystem in the same manner that the suspend signal was provided as described above. Specifically, a suspend/resume signal line 100 is coupled to GENIO. A transition on the suspend/resume signal line 100 may be used to indicate either a suspend request or a resume request. In the preferred embodiment, a suspend request is indicated by a rising edge. This transition 101 is illustrated in FIG. 2. Similarly, a resume request is indicated by a falling edge. Such a falling edge 600 is also shown in FIG. 2. It will be apparent to those skilled in the art that the direction of the signal transition is in material to the operation of the present invention. Equivalent embodiments of the present invention are conceivable where signals are either active high or active low.

Once GENIO receives a resume request on signal line 100, transition 600 occurs as shown in FIG. 2. When this occurs, GENIO deactivates the SYS_PWR_OFF signal supplied generally to the system 10. This deactivation is depicted by edge 900 shown in FIG. 2. GENIO then enables power to all system peripherals and controllers. Lastly, GENIO enables communication on bus 11 by removing the tri-state condition on the pins connecting the bus 11. Similarly, as a result of the deactivation of the SYS_PWR_OFF signal, GENVGA enables its communication on bus 11 by removing the tri-state condition on its pins connecting the bus 11.

Upon deactivation of the SYS_PWR_OFF signal, GENCPU is reset and vectored to processing logic for handling the resume request. This processing logic restores the system state previously saved in the power management memory area. The GENCPU interface to the bus is enabled by removing the tri-state condition on the interface pins. GENCPU then initiates another bus write cycle (IOW) for the purpose of resetting the IO_SUS_REF and VGA_SUS_REF control bits in the PM_SUS_REF register. This IOW cycle is depicted by edge 700 in FIG. 2. The resulting reset of the IO_SUS_REF and VGA_SUS_REF bits is shown by edge 800 in FIG. 2.

GENIO terminates the generation of the slow (32 KHz) refresh signal REFREQ 91 when the IO_SUS_REF bit is reset by GENCPU. The termination of the slow refresh clock is depicted by the final slow pulse 1000 in FIG. 2.

Once GENVGA senses the deactivation of the VGA_SUS_REF bit while the SYS_PWR_OFF signal is also inactive, GENVGA enables its clock used for normal (48 MHz) video DRAM refresh. In an alternative embodiment, GENVGA does not use the VGA_SUS_REF bit to signal the switch to fast refresh. Instead, GENVGA delays for a time period after receiving a deactivated SYS_PWR_OFF signal. In the preferred embodiment, however, the combination of VGA_SUS_REF bit and the SYS_PWR_OFF signal provides a better implementation. GENVGA then begins to refresh video DRAM 50 using the normal (48 MHz) clock. Once the normal clock is active, GENCPU also begins to refresh system memory 80 using the normal (16 MHz) clock supplied by oscillator 21. Once DRAM is being refreshed using a faster clock, normal operation of the computer system 10 may be resumed.

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims.

What is claimed is:

1. In a computer system with a limited source of power and memory being refreshed using a first clock, an improvement for conserving power in refreshing the memory comprising:

suspend mode generation means for generating a suspend signal upon activation of a power suspend mode, the power suspend mode being activated in response to a first event internal to the computer system and a second event external to the computer system;

an input/output unit coupled to receive said suspend signal and for generating an interrupt in response thereto;

a central processing unit coupled to receive said interrupt and in response thereto for generating a first suspend control bit and a second suspend control bit and for saving current system registers and stack pointers of said computer system to a particular location in said memory in response to said interrupt, said central processing unit coupled to system dynamic memory;

wherein said system dynamic memory is a portion of said memory, wherein said input/output unit is coupled to receive said first suspend control bit and is also for generating a power off signal in response thereto;

a video interface device coupled to a video dynamic memory wherein said video dynamic memory is a portion of said memory, said video interface device coupled to receive said second suspend control bit;

resume mode generation means coupled to the CPU for generating a resume signal upon deactivation of the power suspend mode, the power suspend mode being deactivated in response to a third event internal to the computer system and a fourth event external to the computer system;

wherein the input/output unit comprises clock generation means, coupled to the suspend mode generation means and the resume mode generation means, for generating a second clock slower than the first clock, the second clock being fast enough to be used to refresh said system and video dynamic memory without causing a loss of data contained therein;

means for refreshing the video dynamic memory and the system dynamic memory using the second clock in response to said second suspend control bit and said power off signal, respectively, to place said memory into a reduced power state;

means for disabling the first clock after the suspend signal is received from the suspend mode generation means;

means for enabling the first clock after the resume signal is received from the resume mode generation means; and means for refreshing the system dynamic memory and the video dynamic memory using the first clock after the resume signal is received from the resume mode generation means.

2. The improved computer system of claim 1 wherein said computer system is battery powered.

3. The improved computer system of claim 1 wherein said system dynamic memory is DRAM and wherein said video dynamic memory is DRAM.

4. The improved computer system of claim 1 wherein said second event external to the computer system includes a transition of an electrical signal applied to an external circuit pin.

5. The improved computer system of claim 1 wherein said fourth event external to the computer system includes a transition of an electrical signal applied to an external circuit pin.

6. The improved computer system of claim 1 further including means for detecting a battery low condition coupled to said suspend mode generation means and wherein said first event internal to the computer system includes detection of said battery low condition.

7. The improved computer system of claim 1 further including means for detecting a ring detect signal coupled to said resume mode generation means and wherein said fourth event external to the computer system includes receipt of said ring detect signal.

8. The improved computer system of claim 1 further including an input device and a timer, said timer is reset upon each activation of said input device, said timer is coupled to said suspend mode generation means, and wherein said first event internal to the computer system includes said time-out of said timer.

9. The improved computer system of claim 1 further including an input device, said resume signal generation means further including means for receiving an input signal generated by said input device upon activation of said input device, and wherein said external to the computer includes receipt of the input signal.

10. The improved computer system of claim 1 wherein said computer system is housed in a case, said case including a button activated upon closure of said case, said suspend signal generation means further including means for receiving a signal upon activation of said button, and wherein said second event external to the computer system includes receipt of the signal.

11. The improved computer system of claim 1 wherein said computer system is housed in a case, said case including a button de-activated upon opening said case, said resume signal generation means further including means for receiving a signal upon de-activation of said button, and wherein said fourth event external to the computer system includes receipt of said signal.

12. In a computer system with a limited source of power, the computer system including a central processing unit (CPU) coupled to system dynamic memory and video dynamic memory coupled to a video interface unit, said system and video dynamic memory being refreshed using a first clock, a process for conserving power in refreshing the system and video dynamic memory, the process comprising the steps of:

generating a suspend signal upon activation of a power suspend mode in response to a one of a first event internal to the computer system and a second event external to the computer system;

generating an interrupt via an input/output unit responsive to said suspend signal;

generating a first suspend control bit and a second suspend control bit via a central processing unit responsive to said interrupt;

saving current system registers and stack pointers of said computer system via said central processing unit responsive to said interrupt;

generating a power off signal via said input/output unit responsive to said first suspend control bit;

generating a resume signal upon deactivation of the power suspend mode in response to a one of the third event internal to the computer system and a fourth event external to the computer system;

generating a second clock slower than the first clock, the second clock being fast enough to be used to refresh the system and video dynamic memory without causing a loss of data contained therein;

placing said system and video dynamic memory into a reduced power state by refreshing said system and video dynamic memory using the second clock, said step of placing said system and video dynamic memory into a reduced Dower state responsive to said power off signal and said second suspend control bit, respectively;

disabling said first clock after the suspend signal after the step of generating a suspend signal;

enabling the first clock after the resume signal after the step of generating a resume signal; and refreshing said dynamic memory using the first clock after the resume signal is received.

13. The process of claim 12 wherein said computer system is battery powered.

14. The process of claim 12 wherein said system dynamic memory is DRAM and wherein said video dynamic memory is DRAM.

15. The process of claim 12 wherein said second event external to the computer system includes a transition of an electrical signal applied to an external circuit pin.

16. The process of claim 12 wherein said fourth event external to the computer system includes a transition of an electrical signal applied to an external circuit pin.

17. The process of claim 12 further including a step of detecting a battery low condition and wherein said first event internal to the computer system includes detection of said battery low condition.

18. The process of claim 12 further including a step of detecting a ring detect signal, wherein said fourth event external to the computer system includes receipt of said ring detect signal.

19. The process of claim 12 wherein said computer system further includes an input device and a timer and wherein said first event internal to the computer system includes:

resetting said timer upon each activation of said input device.

20. The process of claim 12 wherein said computer system further includes an input device third event internal to the computer system includes:

receiving an input signal generated by said input device upon activation of said input device.

21. The process of claim 12 wherein said computer system is housed in a case, said case including a button activated upon closure of said case and wherein said second event external to the computer system includes:

receiving a signal upon activation of said button.

22. The process of claim 12 wherein said computer system is housed in a case, said case including a button de-activated upon opening said case and wherein said fourth event external to the computer system includes:

receiving a signal upon de-activation of said button.

23. In a computer system with a limited source of power and memory being refreshed using a first clock, an apparatus for conserving power in refreshing parts of said memory, said apparatus comprising:

suspend mode generation circuitry generating a suspend signal upon activation of a power suspend mode, said power suspend mode being activated in response to a first event internal to said computer system and a second event external to said computer system;

an input/output unit coupled to receive said suspend signal and for generating an interrupt in response thereto;

a central processing unit coupled to receive said interrupt and in response thereto for generating a first suspend control bit and a second suspend control bit and for saving current system registers and stack pointers of said computer system to a particular location in memory in response to said interrupt, said central processing unit coupled to system dynamic memory;

wherein said system dynamic memory is a portion of said memory and wherein said input/output unit is coupled to receive said first suspend control bit and is also for generating a power off signal in response thereto;

a video interface device coupled to a video dynamic memory wherein said video dynamic memory is a portion of said memory, said video interface device coupled to receive said second suspend control bit;

resume mode generation circuitry coupled to said CPU for generating a resume signal upon deactivation of said power suspend mode, said power suspend mode being deactivated in response to a third event internal to said computer system and a fourth event external to said computer system;

clock generation circuitry, coupled to said suspend mode generation circuitry and said resume mode generation circuitry, for generating a second clock slower than said first clock, said second clock being fast enough to be used to refresh said system dynamic memory and said video dynamic memory without causing a loss of data contained therein;

circuitry for refreshing said video dynamic memory and said system dynamic memory using said second clock in response to said second suspend control bit and said power down signal, respectively, to place said computer system into a reduced power consumption state;

circuitry for disabling said first clock after said suspend signal is received from said suspend mode generation circuitry;

circuitry for enabling said first clock after said resume signal is received from said resume mode generation circuitry; and circuitry for refreshing said system dynamic memory and said video dynamic memory using said first clock after said resume signal is received from said resume mode generation circuitry.

24. The apparatus claim 23 wherein said second event external to said computer system includes a transition of an electrical signal applied to an external circuit pin and wherein said fourth event external to said computer system includes a transition of an electrical signal applied to an external circuit pin.

25. The apparatus of claim 23 further including circuitry for detecting a battery low condition coupled to said suspend mode generation circuitry and wherein said first event internal to said computer system includes detection of said battery low condition.

26. The apparatus of claim 23 further including circuitry for detecting a ring detect signal coupled to said resume mode generation circuitry and wherein said fourth event external to said computer system includes receipt of said ring detect signal.

27. The apparatus of claim 23 further including an input device and a timer, said timer is reset upon each activation of said input device, said timer is coupled to said suspend mode generation circuitry, and wherein said first event internal to said computer system includes said time-out of said timer.

28. The apparatus of claim 23 further including an input device, said resume signal generation circuitry further including circuitry for receiving an input signal generated by said input device upon activation of said input device, and wherein said external to said computer includes receipt of said input signal.

29. The apparatus of claim 23 wherein said computer system is housed in a case, said case including a button activated upon closure of said case, said suspend signal generation circuitry further including circuitry for receiving a signal upon activation of said button, and wherein said second event external to said computer system includes receipt of said signal.

30. The apparatus of claim 23 wherein said computer system is housed in a case, said case including a button de-activated upon opening said case, said resume signal generation circuitry further including circuitry for receiving a signal upon deactivation of said button, and wherein said fourth event external to said computer system includes receipt of said signal.

* * * * *

UNITED STATES PATENT AND TRADEMARK OFFICE
CERTIFICATE OF CORRECTION

PATENT NO. : 5,465,367
DATED : November 7, 1995
INVENTOR(S) : Reddy et al.

It is certified that error appears in the above-indentified patent and that said Letters Patent is hereby corrected as shown below:

In column 2 at line 47 delete "tile" and insert --the--

In column 3 at line 2, delete "tile" and insert --the--

In column 3 at line 66 delete "liming" and insert --timing--

In column 4 at line 23 delete "brief" and insert --briefly--

In column 4 at line 44 delete "tile" and insert --the--

In column 4 at line 46 delete "tile" and insert --the--

UNITED STATES PATENT AND TRADEMARK OFFICE
CERTIFICATE OF CORRECTION

PATENT NO. : 5,465,367
DATED : November 7, 1995
INVENTOR(S) : Reddy et al

It is certified that error appears in the above-indentified patent and that said Letters Patent is hereby corrected as shown below:

In column 4 at line 62 delete "tile" and insert --the--

In column 5 at line 65 delete "tile" and insert --the--

In column 5 at line 66 delete "con, purer" and insert --computer--

In column 6 at line 8 delete "tile" and insert --the--

In column 6 at line 11 delete "tile" and insert --the--

In column 10 at line 50 delete "Dower" and insert --power--

Signed and Sealed this

Twenty-second Day of July, 1997

*Attest:*

*Attesting Officer*

BRUCE LEHMAN

*Commissioner of Patents and Trademarks*